US005602775A

United States Patent [19]
Vo

[11] Patent Number: 5,602,775
[45] Date of Patent: Feb. 11, 1997

[54] FLASH EEPROM MEMORY SYSTEM FOR LOW VOLTAGE OPERATION AND METHOD

[75] Inventor: Hai H. Vo, Gilroy, Calif.

[73] Assignee: National Semiconductor Corporation, Santa Clara, Calif.

[21] Appl. No.: 404,510

[22] Filed: Mar. 15, 1995

[51] Int. Cl.[6] .................................................. G11C 7/00
[52] U.S. Cl. .............................. 365/185.01; 365/185.29; 365/218
[58] Field of Search .................................... 365/185, 218, 365/900, 185.01, 185.29, 210, 185.21

[56] References Cited

U.S. PATENT DOCUMENTS

| | | | |
|---|---|---|---|
| 5,077,691 | 12/1991 | Haddad et al. | 365/218 |
| 5,280,446 | 1/1994 | Ma et al. | 365/185 |
| 5,313,432 | 5/1994 | Lin et al. | 365/185 X |
| 5,341,329 | 8/1994 | Takebuchi | 365/185 |

Primary Examiner—Son T. Dinh
Attorney, Agent, or Firm—Limbach & Limbach L.L.P.

[57] ABSTRACT

A flash memory system utilizing low threshold voltage cells so as to provide adequate cell current during read operations even with at low power supply voltages. The cells are arranged into an array of rows and columns, with the source regions of all of the cells connected to a common source line, the drain regions of the cells in one of the columns connected to a common bit line and the control gates of the cells in one of the rows connected to a common word line. In program operations, voltages are applied to the cells so that the program current flows from the cell bit line to the common source line. This results in electrons being injected from the drain toward the floating gate and the floating gate thereby altering the threshold voltage of the cell. In read operation, voltages are applied so that current flow is in the opposite direction, namely from the source line to the bit line. The read current is then sensed at the source line by way of a sense amplifier and associated circuitry. This arrangement minimizes undesirable leakage currents during read operations notwithstanding the use of low threshold voltage memory cells.

22 Claims, 4 Drawing Sheets

FLASH EEPROM MEMORY SYSTEM FOR LOW VOLTAGE OPERATION AND METHOD

BACKGROUND OF THE INVENTION

1. Field of the Invention

The present invention relates to electrically erasable, programmable, read only memory (EEPROM) devices and, in particular, to a flash EEPROM memory system suitable for low voltage operation and a method of controlling such memory.

2. Background Art

Programmable, electrically erasable, read only memories are non-volatile field effect devices which utilize a floating gate structure. Standard EEPROMs, or electrically erasable, programmable memories, include memories wherein the cells may be individually programmed and erased. However, this type of EEPROM requires a wide range of voltages for programming, reading and erasing and the cells are relatively large.

Flash EEPROMs have been developed which have a smaller cell size then standard EEPROM. Flash EEPROMs have cells that cannot be individually erased, but are erased either in bulk or by sector. Referring now to the drawings, FIG. 1A depicts a conventional N channel flash EEPROM memory cell 18, commonly referred to as the Intel ETOX cell or simply the ETOX cell. The cell includes a graded N type source region 20 diffused into a P type substrate 22. An N type drain region 24 is also diffused into the substrate 22 so as to define a channel region 22a between the source and drain regions. The source region 20 is formed more deeply into the substrate 22 than is the drain region 24.

A polysilicon floating gate 26 is disposed above the channel 22a and is separated from the channel by a thin (about 100 Å) gate oxide 28. A portion of floating gate 26 extends over the graded source region 20. A polysilicon control gate 30 is disposed above the floating gate 26 and is separated from the floating gate by an interpoly dielectric layer 32.

FIGS. 1A–1C show typical conditions for programming, reading and erasing the cell 18, assuming that the primary supply voltage Vcc is +5 volts.

As shown in FIG. 1A, the ETOX flash cell is programmed by applying a programming voltage +Vpp (typically +6 to +8 volts) to the drain region 24 and a higher voltage Vgg (typically +10 to +13 volts) to the control electrode. The source region is grounded (Vss). Voltage +Vpp is usually supplied from an external source and voltage Vgg is usually provided by way of a charge pump type circuit. Alternatively, both Vpp and Vgg can be provided by a charge pump circuit, with only primary voltage Vcc being provided by an external source or supply.

The ETOX cell is programmed in the conventional standard EEPROM manner. Electrons exit the source 20 and are accelerated across the channel 22a towards the drain region 24. As the electrons approach the drain, the positive charge on the control gate 32 results in avalanche or hot electron injection near the drain 24 through the gate oxide and into the polysilicon floating gate 26. As will be explained, the presence of electrons on the floating gate 26 of a programmed cell produces characteristics which differ from an unprogrammed cell.

The conventional ETOX cell is read in the manner shown in FIG. 1B. The source region 20 is grounded (Vss) and an intermediate voltage +Vf (typically +1 to +1.5 volts) is applied to the drain region 24. Voltage +Vcc is applied to the control gate 30. In the case where the cell had been previously programmed, the negative charge present on the floating gate will tend to prevent the positive voltage on the control electrode 32 from inverting the channel. Thus, the negative charge on the gate effectively increases the threshold voltage of the cell so that the cell will not be rendered conductive by the voltage +Vcc applied to the control gate 30. Accordingly, no current flow will take place through the cell other than some amount of leakage current.

In the event the cell of FIG. 1B was not previously programmed, the threshold voltage of the cell will be sufficiently low such that the cell will be rendered conductive by voltage +Vcc. This will result in current flow through the cell which will be detected by the sense amplifier.

The ETOX cell is erased in the manner depicted in FIG. 1C. The drain region 24 is left open (floating) and control gate 30 is grounded (Vss).

Positive voltage +Vee, typically ranging from +11 to +13 volts, is applied to the source region 20 which results in electrons being drawn off floating gate 26 through the thin gate oxide 28 to the graded source region 20. This occurs in the region of the graded source which underlies the floating gate 26. The mechanism for such removal of electrons is known as Fowler-Nordheim tunneling. The graded source 20 provides a smooth curvature which increases the gate-aided junction break down voltage. Thus, the asymmetrical drain/source configuration, including the graded source and the section of the source underlying the floating gate 26 enhances the Fowler-Nordheim tunneling mechanism used in the erase process.

FIG. 2 shows a conventional memory array 32 comprised of flash cells 18 arranged in rows and columns. The source regions 20 of each of the cells is connected to a common source line S. Note that cells located in a particular column are arranged in pairs, such as the pair comprising cells 18A and 18B, with each cell 18 of a pair having a reversed orientation so that the source regions are adjacent to one another. The drain region 24 of each cell 18 located in a particular column is connected to a common bit line BLN. Further, the control electrode 30 of each cell located in a particular row is connected to a common word line WLN.

The memory system includes the memory array 32 and associated circuitry (not depicted) for decoding read/write addresses and for applying the appropriate voltages necessary for carrying out the program, read and erase steps. In addition, the associated circuitry includes sense amplifiers and related components for reading the array.

Operation of the conventional memory system is best described by way of example. If cell 18A is to be programmed, positive voltage +Vgg is applied to the selected word line WL1. The deselected word lines WL0, WL2, WL3 and WLN are all grounded. In addition, positive voltage +Vpp is applied to the selected bit line BL2, with the deselected bit lines all being grounded (Vss). Cell 18A will be programmed as previously described in connection with FIG. 1A. The deselected cells in the same column, such as cell 18B, will not be programmed because of the deselected word lines, including line WL0, are grounded. Similarly, the deselected cells in the same row, such as cell 18C, will not be programmed because the deselected bit lines, including line BL1, are grounded (Vss).

Reading is carried out by applying voltage +Vcc to the selected word line, such as line WL1 if cell 18A is to be read. The deselected word lines, WL0, WL2, WL3 and WLN, are all grounded as is the common source line S. Further, the deselected bit lines BL0, BL1 and BAN are all grounded (Vss) and the selected bit line BL1 will be connected to positive voltage +Vf. The deselected cells will not be rendered conductive. For cells in the same column, such as cell 18B, the grounded word line WL0 will maintain the cell in a non-conductive condition. For deselected cells in the same row, such as cell 18C, such cells will remain non-conductive since the associated bit lines are grounded (Vss).

Although not depicted, the memory system includes a sense amplifier and load associated with each column for sensing current flow through any of the cells located in the column. The load, which is typically an MOS transistor, is connected between the bit line and voltage +Vcc and functions as a voltage divider so as to produce voltage +Vf when no current is flowing through the bit line. In the event the selected cell 18A is in the unprogrammed or erased state, the cell will conduct current so that current flow will take place between bit line BL1 and the common source line S. The current will flow through the associated load will cause the voltage on the bit line to drop from the quiescent value of +Vf to a lower value. In the event the cell has been programmed, the cell will remain non-conductive and the voltage on the bit line will remain unchanged except for the changes attributable to leakage current. The output of the sense amplifier will thus reflect the programmed state of the selected cell.

The erase sequence is carried out by connecting the common source line S to positive voltage +Vee, grounding (Vss) all of the word lines WLN and floating all of the bit lines BAN. This causes all of the cells 18 of the array to be erased.

There has been a tendency to reduce the magnitude of the supply voltage so as to permit battery operation. By way of example, voltage +Vcc can be reduced from a typical value of +5 volts to +3 volts. The other voltages, including voltages +Vp and +Vgg, are then typically generated using on-chip charge pump circuitry.

One disadvantage of low voltage operation is that a low value of +Vcc results in a low cell current during a read operation (FIG. 1B). A low cell current results in slow access times since the amount of current available to charge and discharge the memory line capacitances is small. In order to increase the cell current, it would be possible to utilize an on-chip charge pump to generate a larger voltage +Vcc, but charge pumps increase the die size and waste power. Further, since the voltage +Vcc applied to the control electrode must be rapidly switched on and off during successive read operations, the inherent slow speed of charge pumps greatly reduces the time required to read the memory. Since memory read operations are much more critical to overall speed of the memory as compared to program and erase operations, this is highly undesirable.

One approach to increasing cell current is to decrease the threshold voltage of the cell. However, this will result in large leakage currents in deselected cells despite the fact that a low voltage is applied to the control gate of such cells. In addition, there is a tendency to program cells having a low threshold voltage when such cells are read. This phenomena, known as program disturb, is not desirable.

The present invention overcomes the above-noted shortcomings of conventional memory systems. Low voltage operation is achieved without the use of charge pumps to supply voltage +Vcc. Further, cell current is sufficient so as to maintain high speed memory read operations while maintaining immunity to leakage current from deselected cells and while avoiding program disturb. These and other advantages of the present invention will be apparent to those skilled in the art upon a reading of the following Detailed Description of the Invention together with the drawings.

SUMMARY OF THE INVENTION

A flash memory system is disclosed which includes an array of flash memory cells and control means for controlling operation of the system. The cells each include a source region, a drain region, a channel region intermediate the source and drain regions, a floating gate disposed over and insulated from the channel region and a control gate disposed over and insulated from the floating gate. The cell is preferably an N channel device and is fabricated to have a relatively low threshold voltage so that the system is operable at low supply voltages.

The cells located in one of the array columns have their drain regions connected to a common bit line and the cells located in a row have their control gates connected to a common word line. All of the cells of the array have their sources connected to a common source line.

The memory system further includes control means for controlling the operation of the system. The control means includes erase means for erasing the memory cells, program means for programming the memory cells and read means for reading the memory cells. The program means includes means for applying a positive voltage with respect to the memory array circuit common to the bit line associated with the cell to be programmed. Preferably, the source line is grounded so that current flow through the cell being programmed is from the drain connected to the bit line to the grounded source.

The read means of the control means includes means for applying a positive voltage with respect to the array circuit common to the common source line. The bit line associated with the cell being read is at a lower voltage so that current flow will be in the opposite direction as occurs when the cell is programmed. The cell can then be read at the source line. As will be explained, this arrangement greatly reduces leakage current despite the low cell threshold voltage.

DETAILED DESCRIPTION OF THE INVENTION

Figure 1A:
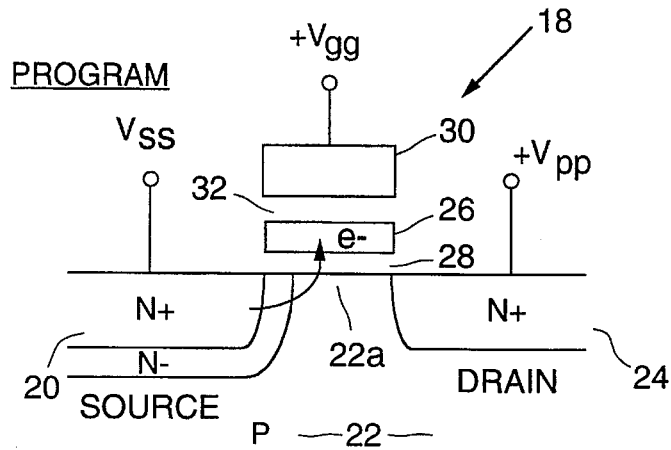
FIGS. 1A–1C depict a conventional flash EEPROM cell and the manner in which the cell is programmed, read and erased, respectively.
Figure 1B:
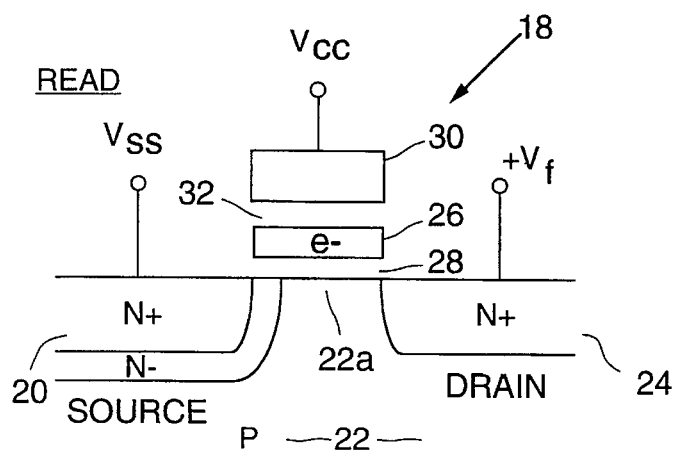
Figure 1C:
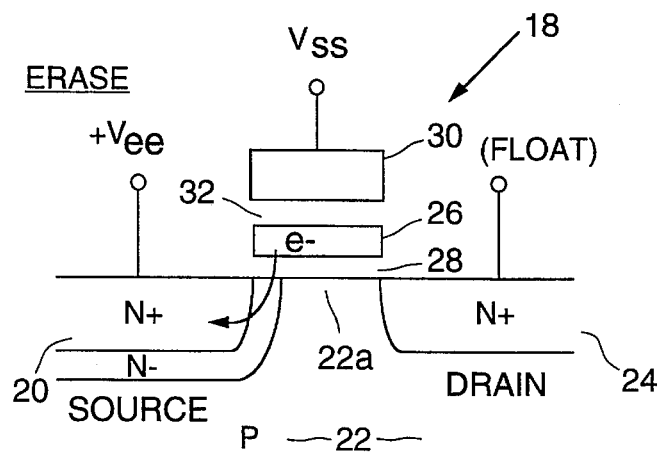
Figure 2:
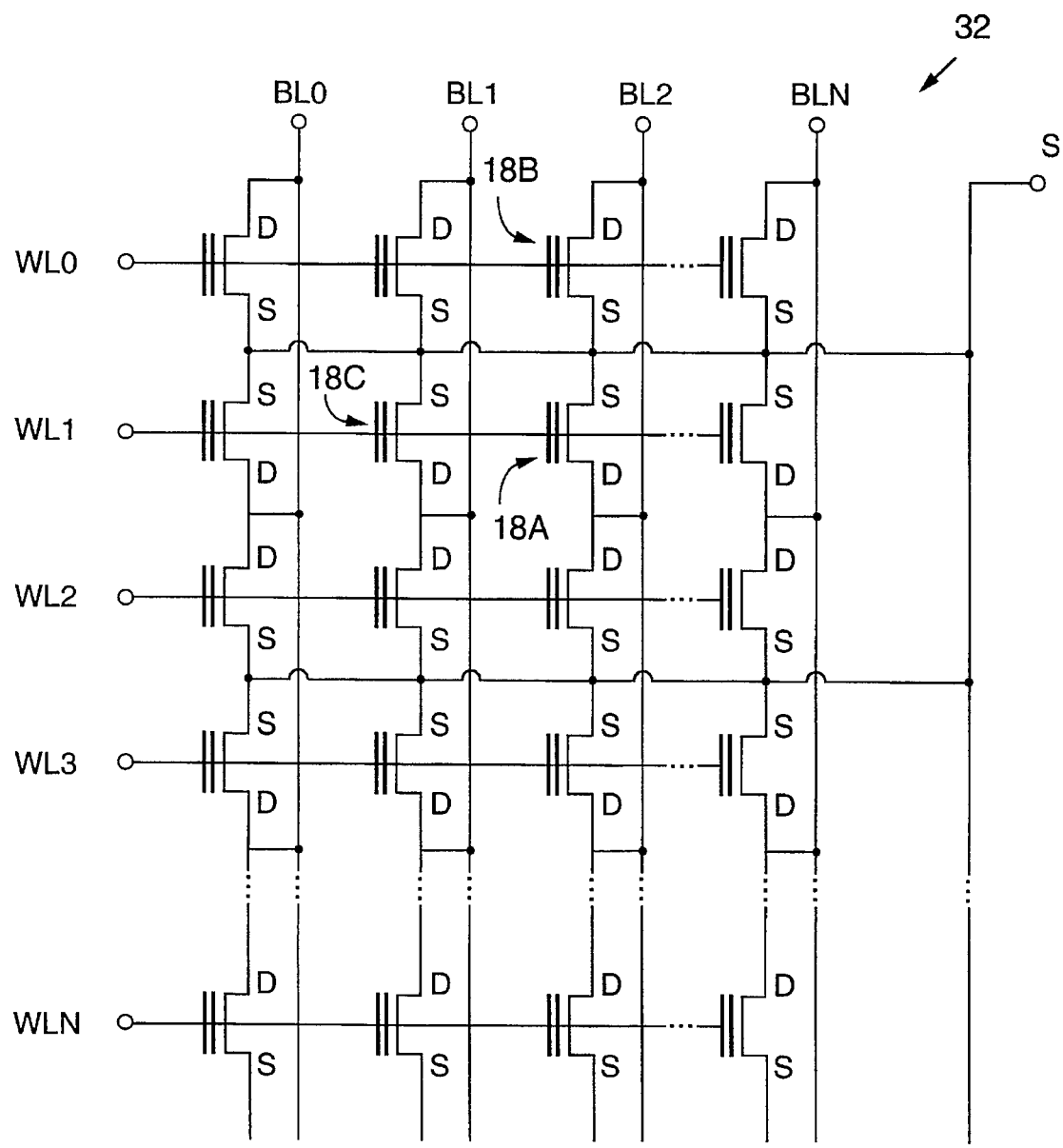
FIG. 2 is a conventional array of flash memory cells arranged in rows and columns.
Figure 3:
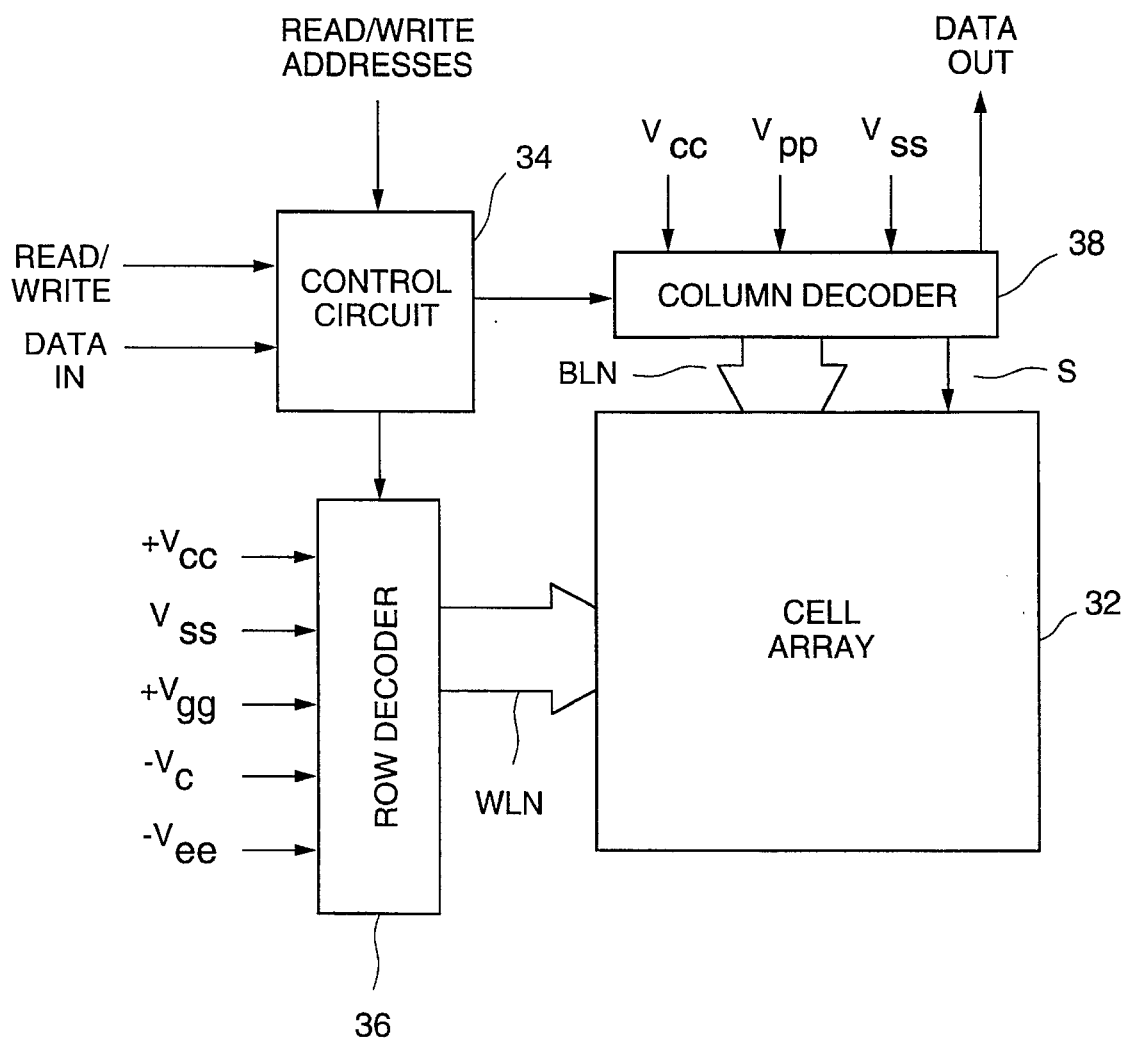
FIG. 3 is a memory system in accordance with the present invention.

Referring again to the drawings, FIG. 3 is a block diagram of the memory system in accordance with the present invention. The system utilizes a conventional array 32 of flash memory cells 18 as depicted in FIG. 2. The cells 18 are similar to those depicted in FIG. 1 and have an asymmetrical drain/source configuration. For purposes of definition, for the N channel devices of FIG. 1, the drain is the region connected to the most positive voltage during a programming sequence. In the event a P channel device is used, the source is the region connected to the most positive voltage during a programming sequence.

The flash memory cells 18 of array 32 have been fabricated to have a low erased threshold voltage Vterase of approximately +0.5±1 volts and a programmed threshold voltage Vtwrite of approximately +4 to +5 volts. The system further includes a Control Circuit 34 for controlling the overall operation of the memory system. Circuit 34 functions to decode addresses to be used for memory reads and memory writes and receives data to be written in the memory. This information is used to control a Row Decoder 36 and a Column Decoder 38 so that certain predetermined voltages are applied to the word lines WLN, bit lines BLN and the source line S to carry out the read, program and erase operations.

Table 1 below shows exemplary voltages to be applied to the array 32 for carrying out these operations. These voltages are suitable for operating the memory system from a +3 volt battery supply. Voltage +Vcc is the +3 volt battery voltage, with the remaining voltages preferably being produced by on-chip positive and negative charge pumps. Of course, these nominal voltages may have to be adjusted depending upon the actual process dependent characteristics of the flash cells 18.

TABLE 1

|  | READ | PROGRAM | ERASE |
| --- | --- | --- | --- |
| SELECTED WORD LINE | +Vcc (+3 volts) | +Vgg (≦+10 volts) | −Vee (−13 to −16 volts) |
| DESELECTED WORD LINE | Vss (ground) | −Vc (−2 volts) | −Vee (−13 to −16 volts) |
| SELECTED BIT LINE | +Vf (+0.5 to +1 volts) | +Vpp (+5 to +6 volts) | Vss or F (ground or floating) |
| DESELECTED BIT LINE | +Vcc (+3 volts) | Vss (ground) | Vss or F (ground or floating) |
| SOURCE LINE | +Vcc (+3 volts) | Vss (ground) | +Vcc (+3 volts) |

As set forth in Table 1, a selected cell 18A (FIG. 2) is programmed by causing Row Decoder 36 to apply voltage +Vgg of +10 volts or less to the selected word line, this being line WL1 for selected cell 18A. This value compares to +12 to +13 volts usually used for programming cells having the more typical lower programmed threshold voltages Vtwrite of +4 to +5 volts. The Control Circuit 34 also causes Row Decoder 36 to apply voltage −Vc of −2 volts to the deselected word lines WL0, WL2, WL3 and WLN. Again, this value compares to the typical approach of grounding the deselected word lines for cells having a higher Vterase threshold voltage.

As can be seen in Table 1, the program sequence is further carried out by the Control Circuit 34 causing the Column Decoder 38 to apply voltage +Vpp of +6 volts to the selected bit line BL2 and to ground (Vss) the deselected bit lines BL0, BL1 and BLN. In addition, Column Decoder 38 is caused to ground (Vss) the common source line S.

With the above-described conditions, cell 18A will be programmed by way of hot electron injection from the grounded source region. The deselected cells in the same column as cell 18A, such as cell 18B, will not be programmed due to the negative voltage −Vc being applied to the control gate by way of the associated word line WL0. The deselected cells in the same row but different column, such as cell 18C, will not be programmed due to the grounding of the associated deselected bit line BL1. The other deselected cells of the array will not be programmed due to the combination of grounded deselected bit line and the negative voltage −Vc applied to the deselected word line. Such negative voltage further functions to reduce the leakage current of other cells located in the same column as the target cell 18A.

As can also be seen in Table 1, the entire array is erased when the Control Circuit 34 causes the Row and Column decoders to apply −Vee ranging from −13 to −16 volts to all of the word lines and to either ground (Vss) all of the bit lines or leave all of the bit lines floating. In addition, the Column Decoder 36 is directed to apply voltage +Vcc of +3 volts to the common source line S. Under these conditions, all of the cells 18 of the array will be erased by way of Fowler-Nordheim tunneling.

In some applications, it may be desirable to erase less than the entire array. In that event, the array is divided into segments, with each segment having a common source line S. Such array segments are considered to be an array in itself, as that term is used here. Similarly, the array can be configured so that more than a single cell, such as a byte, can be programmed in a single operation and can be read in a single operation. Such arrays are typically implemented by operating array segments in parallel. In that event, the portion of the array containing a single cell of the group, an array segment, is considered to be an array in itself, as that term is used here.

Table 1 also shows the voltages applied by the Column Decoder 38 and Row Decoder 36 for reading a selected cell 18A of the array 32. The Row Decoder is caused to apply +Vcc of +3 volts to the selected word line WL1 and to ground (Vss) the remaining deselected word lines WL0, WL2, WL3 and WLN. The Column Decoder 38 is caused to apply voltage +Vf to the selected bit line BL2 and to apply voltage +Vcc of +3 volts to the deselected bit lines BL0, BL2 and BLN. Further, the common source line S is also connected to voltage +Vcc of +3 volts by the Column Decoder 38. The Row Decoder is caused to apply voltage +Vcc of +3 volts to the selected word line WL1 and to ground (Vss) the deselected word lines WL0, WL2, WL3 and WLN.

Under the above-described conditions, assuming that selected cell 18A has not been programmed, the cell will conduct current. It is important to note that the direction of current flow will be the opposite to the direction of flow when the cell is programmed. The direction of current will be from the common source line S, which is at +3 volts (+Vcc), to the bit line BL1 which is at a voltage less than +3 volts. Thus, current flow is from the source of the cell to the drain, with the source and drain being defined by the direction of current flow when the cell is programmed.

Figure 4:
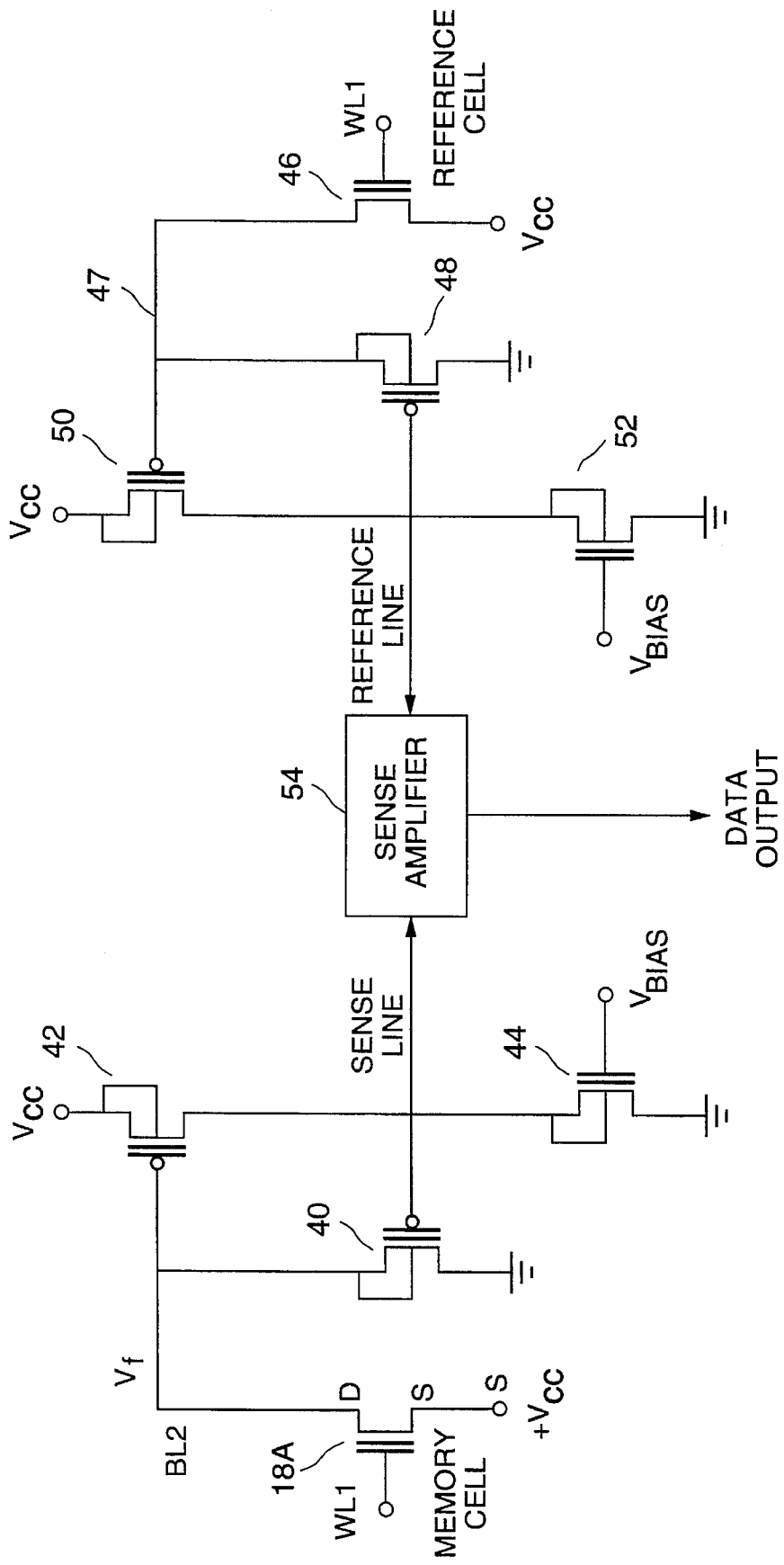
FIG. 4 is a block diagram of the sense amplifier and associated circuitry used in reading cells of the subject memory system.

In conventional flash memory systems, the direction of current flow is from the bit line, through the cell and to the grounded source. In the present memory system, the direction of current flow is in the opposite direction so that specially adapted current sense circuitry is required to carry out a read operation. FIG. 4 shows such special current sense circuitry located in the Column Decoder 38. There is one group of such current sense circuitry associated with each bit of the word length, with the word length being dependent upon the particular memory architecture being used. By way of example, if the architecture is for an eight bit word, there will be a total of eight sense circuits, with the sense circuits being connected by way of decoder transistors (not depicted) to the appropriate column in which the cells 18 are located.

Cell 18A of FIG. 4 represents the selected memory cell. The source of the cell 18 is connected to the common source line S which is connected to voltage +Vcc. The drain of the selected cell 18 is connected to one of the bit lines BLN. The other deselected cells located in the same column are also connected to the same bit line, but are not shown. A P channel MOS transistor 40 is connected between ground and the bit line BLN and acts as a load for the cell 18A during read operations.

A circuit comprising another P channel MOS transistor 42 and an N channel transistor 44 function to amplify and invert the voltage present on the bit line BLN, with such voltage being indicative of the programmed state of the cell 18A. A separate bias voltage is applied to the gate of MOS transistor 44. The output of the read amplifier at the junction of transistors 42 and 44 is connected to a Sense Line. The Sense line is connected back to the gate of MOS transistor 40 to provide positive feedback. Such regeneration functions to increase the gain of the sense circuitry. The Sense line will be at a high voltage if the cell 18A being read is in a programmed state and a low voltage if the cell is in an erased state.

The subject memory system further includes reference circuitry including a reference cell 46 connected to the same voltages as is the cell 18 being read. Reference cell 46 is located in a column of reference cells, with each reference cell being located in a row associated with word lines WL0–WLN. Reference cell 46 is located in the same row as the cell being read and is connected to the same word line WL1. Not shown are the other deselected reference cells located in the reference column in the deselected rows.

A P channel MOS device 48 functions as a load for the reference cell 46. The reference output on line 47 is amplified by an inverting amplifier which includes P channel MOS device 50 and N channel MOS device 52 which are configured in the same manner as MOS devices 42 and 44. The output of the reference circuit inverting amplifier is on the Reference Line.

Reference load MOS transistor 48 has a geometry which is larger than that load MOS transistor 40 so that the voltage drop across transistor 40 is greater than that across transistor 48 for the same amount of cell current. Reference cell 46 is unprogrammed so that it will conduct approximately the same amount of current as the cell 18A being read, assuming that cell 18A is also in an erased state. The leakage current in the deselected cells 18A connected to the same bit line (same column) as the cell 18A being read will tend to be offset by the leakage current of the deselected reference cells (not depicted) also connected to line 47.

The geometries of load MOS devices 40 and 48 are selected so that the voltage on the Reference Line fall midway between the voltage on the Sense Line when the cell 18A being read is in a programmed state and the voltage when the cell being read is in an erased state. A conventional sense amplifier 54 compares the level of the signal on the Sense Line with the level on the Reference Line and produces a corresponding digital output on the Data Output line.

The disclosed memory system is ideal in that the cell 18 current during read operations is large (assuming it is in an erased state) notwithstanding the use of a low value supply voltage +Vcc of +3 volts. The cells are fabricated to have low threshold voltages to provide the high read current yet leakage normally attributable to low threshold voltage cells is minimized. Although the deselected word lines in the read operation are at ground potential (Vss), this would be sufficient in some circumstances to turn on a low threshold voltage cell, should the cell source also be grounded. However, in the present case, the cell source is not grounded, but rather the sources of each of the cells of the array is placed at voltage +Vcc. This functions to reduce the cell leakage current.

The conductivity of the subject memory cells is directly related to the voltage between the control gate and the voltage of the drain region connected to the bit line BLN. A positive voltage equal to the drop across load MOS device 40 will be present on the bit line. From a device physics point of view, the region of cell 18A connected to the bit line BL2 functions as the source but for the sake of consistency in terminology, the regions are defined by their function in program operations. In program operations, the flow of cell current is in the opposite direction, so that the region connected to the bit line functions as the drain. Thus, the gate-drain voltage of the cell during read operations is the primary voltage controlling the conductivity of the cell. The voltage on the bit line BL2 has a polarity which will tend to reduce the gate-drain voltage of the deselected cells located in the same column in which the selected cell is located. Thus, assuming that the selected cell is cell 18A (FIG. 2), the leakage current from these deselected cells, such as cell 18B, will be lower than in the case where the source is connected to ground.

With respect to the deselected cells located in other columns, such as cell 18C, both the drains and sources of these cells are connected to +Vcc. The polarity of the gate-drain voltage is thus in a direction which tends to turn the cell off. Further, since both the drain and source are at the same voltage, there will be insignificant leakage flow through these deselected cells.

It should also be noted that there will be a reduced tendency for a cell 18A being read to be programmed disturbed, despite the low threshold voltage. When cell 18A is read, the source region rather than the drain region is at the positive voltage. Thus, any undesired program current for producing hot electron injection will have to originate from the drain region 24 (FIG. 1A) of the cell rather than the source region. However, since the cells have an asymmetric drain/source configuration, with the cell optimized for the generation of programming currents at the source rather than the drain, there will be a substantially reduced tendency for program disturb to occur.

The subject memory system can be fabricated using conventional integrated circuit processing steps. Such steps form no part of the subject invention and will not be disclosed so as not to obscure the true nature of the invention in unnecessary detail.

Thus, a novel flash memory system has been disclosed capable of operating efficiently at low supply voltages. Although a preferred embodiment of the system has been described in some detail, it is to be understood that changes can be made by those skilled in the art without departing from the spirit and scope of the invention as defined by the appended claims.

I claim:

1. A flash memory system comprising:
    an array of N channel flash memory cells arranged into a multiplicity of rows and columns, with each of the memory cells including a source region, a drain region, a channel region intermediate the drain and source regions, a floating gate overlying and insulated from the channel region and a control gate overlying and insulated from the floating gate, with all of the memory cells of the array having the source regions connected together by a single common source line, with all of the cells located in one of the columns having the drain regions connected together by a common bit line and all of the cells located in one of the rows having the control gates connected together by a common word line; and control means for controlling the operation of the memory system in response to input addresses, said control means including:

erase means for erasing the memory cells;

program means for programming the memory cells; and read means for reading the memory cells, including means for applying a first read voltage to the common source line and a second read voltage to the bit line in which the cell to be read is located such that the source-to-drain voltage is positive.

2. The memory system of claim 1 wherein said program means further includes means for applying a first programming voltage to the bit lines of the array associated with the cells being programmed.

3. The memory system of claim 2 wherein the program means further includes means for applying a second programming voltage to the word lines of the array associated with the cells being programmed.

4. The memory system of claim 3 wherein the second programming voltage has a magnitude which is greater than a magnitude of the first programming voltage.

5. The memory system of claim 1 wherein the drain and source regions of the cells are asymmetrically configured so that source region is more optimized for the generation of programming electrons than is the drain region.

6. A flash memory system comprising:

an array of N channel flash memory cells arranged into a multiplicity of rows and columns, with each of the memory cells including a source region, a drain region, a channel region intermediate the drain and source regions, a floating gate overlying and insulated from the channel region and a control gate overlying and insulated from the floating gate, with all of the memory cells of the array having the source regions connected together by a single common source line, with all of the cells located in one of the columns having the drain regions connected together by a common bit line and all of the cells located in one of the rows having the control gates connected together by a common word line; and control means for controlling the operation of the memory system in response to input addresses, said control means including:

erase means for erasing the memory cells;

program means for programming the memory cells, including means for applying a first programming voltage to the bit line in which the cell to be programmed is located; and read means for reading the memory cells, including means for applying a first read voltage to the common source line and a second read voltage to the bit line in which the cell to be read is located such that the source-to-drain voltage is positive, wherein the read means further includes means for applying a third read voltage to the bit lines of the array other than the bit lines associated with the memory cells being read.

7. The memory system of claim 6 wherein the read means further includes means for applying a fourth read voltage to the word lines of the array other than the word line associated with the memory cells being read.

8. The memory system of claim 6 wherein the second read voltage is greater than the first read voltage.

9. The memory system of claim 7 wherein the third read voltage is less than the first read voltage.

10. The memory system of claim 7 wherein the fourth read voltage includes zero volts.

11. A flash memory system comprising:

an array of N channel flash memory cells arranged into a multiplicity of rows and columns, with each of the memory cells including a source region, a drain region, a channel region intermediate the drain and source regions, a floating gate overlying and insulated from the channel region and a control gate overlying and insulated from the floating gate, with all of the memory cells of the array having the source regions connected together by a single common source line, with all of the cells located in one of the columns having the drain regions connected together by a common bit line and all of the cells located in one of the rows having the control gates connected together by a common word line; and control means for controlling the operation of the memory system in response to input addresses, said control means including:

erase means for erasing the memory cells;

program means for programming the memory cells, including means for applying a first programming voltage to the bit lines of the array associated with the cells being programmed, wherein the program means further includes means for applying a second programming voltage to the word lines of the array associated with the cells being programmed, and means for applying a third programming voltage to the word lines of the array other than the word lines associated with the memory cells being programmed, wherein the third programming voltage is less than second programming voltage; and read means for reading the memory cells, including means for applying a first read voltage to the common source line and a second read voltage to the bit line in which the cell to be read is located such that the source-to-drain voltage is positive.

12. The memory system of claim 11 wherein the program means further includes means for applying a fourth programming voltage to the bit lines of the array other than the bit lines associated with the memory cells being read, wherein the third programming voltage is less than the fourth programming voltage.

13. The memory system of claim 12 wherein the erase means includes means for applying a first erasing voltage to the common source line.

14. The memory system of claim 13 wherein the erase means includes means for applying a second erasing voltage to the word lines of the array, wherein the second erasing voltage is less than the first erasing voltage.

15. The memory system of claim 11 wherein the third programming voltage includes a negative voltage.

16. The memory system of claim 12 wherein the fourth programming voltage includes zero volts.

17. The memory system of claim 14 wherein the third erasing voltage includes zero volts.

18. A method of controlling a flash memory system which includes an array of flash memory cells wherein the memory cells each include a drain region, a source region and a control gate and are arranged in a multiplicity of rows and a multiplicity of columns, with the cells in one of the columns having their drains connected to a common bit line and the cells in one of the rows having their control gates connected to a common word line and with all of the cells having their source regions connected to a single common source line, comprising the following steps:

programming a selected one of the cells in response to a received memory address, said step of programming causing current flow through the programmed cell to flow in a first direction; and reading a selected one of the cell in response to a received memory address, said step of reading causing current flow through the read cell in a second direction opposite the first direction.

19. The method of claim 18 wherein the step of reading includes the step of applying a positive voltage, to the source line and wherein the step of programming includes the step of applying a zero potential voltage, to the source line.

20. A method of controlling a flash memory system which includes an array of flash memory cells wherein the memory cells each include a drain region, a source region and a control gate and are arranged in a multiplicity of rows and a multiplicity of columns, with the cells in one of the columns having their drains connected to a common bit line and the cells in one of the rows having their control gates connected to a common word line and with all of the cells having their source regions connected to a single common source line, comprising the following steps:

programming a selected one of the cells in response to a received memory address, said step of programming causing current flow through the programmed cell to flow in a first direction, wherein the step of programming includes the step of applying a zero potential voltage to the source line; and reading a selected one of the cell in response to a received memory address, said step of reading causing current flow through the read cell in a second direction opposite the first direction, wherein the step of reading includes the step of applying a positive voltage to the source line, wherein the method of controlling the memory system includes the step of erasing the memory cells, said erasing step including the step of applying a positive voltage to the source line.

21. The method of claim 20 wherein the step of reading includes the step of applying a positive voltage to the bit lines of the array other than the bit line associated with the cell being read.

22. The method of claim 21 wherein in the step of reading, the magnitude of the voltages applied to bit lines other than the bit line associated with the cell being read and the positive voltage applied to the source line during reading are the same.

* * * * *

UNITED STATES PATENT AND TRADEMARK OFFICE
CERTIFICATE OF CORRECTION

PATENT NO. : 5,602,775
DATED : February 11, 1997
INVENTOR(S) : Hai H. Vo

It is certified that error appears in the above-indentified patent and that said Letters Patent is hereby corrected as shown below:

In Col. 11, line 4, after "address" insert --by applying a first voltage to the source region and a second voltage to the drain region so that the source-to-drain voltage is negative--.

In Col. 11, line 8, after "address" insert --by applying a third voltage to the source region and a fourth voltage to the drain region so that the source-to-drain voltage is positive--.

Signed and Sealed this

Twenty-second Day of July, 1997

Attest:

BRUCE LEHMAN

*Attesting Officer*  *Commissioner of Patents and Trademarks*